(12) United States Patent
Tegen et al.

(10) Patent No.: US 12,094,969 B2
(45) Date of Patent: Sep. 17, 2024

(54) TRANSISTOR DEVICE HAVING A FIELD PLATE

(71) Applicant: Infineon Technologies Austria AG, Villach (AT)

(72) Inventors: Stefan Tegen, Dresden (DE); Matthias Kroenke, Dresden (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 18/487,505

(22) Filed: Oct. 16, 2023

(65) Prior Publication Data

US 2024/0047573 A1 Feb. 8, 2024

Related U.S. Application Data

(60) Continuation of application No. 17/985,315, filed on Nov. 11, 2022, now Pat. No. 11,824,114, which is a
(Continued)

(30) Foreign Application Priority Data

Jan. 29, 2020 (EP) ..................................... 20154375

(51) Int. Cl.
*H01L 29/78* (2006.01)
*H01L 29/40* (2006.01)
(Continued)

(52) U.S. Cl.
CPC ........ *H01L 29/7813* (2013.01); *H01L 29/401* (2013.01); *H01L 29/402* (2013.01); *H01L 29/404* (2013.01); *H01L 29/407* (2013.01); *H01L 29/42356* (2013.01); *H01L 29/4236* (2013.01); *H01L 29/42368* (2013.01);
(Continued)

(58) Field of Classification Search
CPC ........... H01L 29/7813; H01L 29/42356; H01L 29/4236; H01L 29/7397; H01L 29/7827; H01L 29/407; H01L 29/404; H01L 29/402
See application file for complete search history.

(56) References Cited

U.S. PATENT DOCUMENTS 8,372,717 B2 2/2013 Hsieh
8,871,593 B1 10/2014 Siemieniec et al.
(Continued)

FOREIGN PATENT DOCUMENTS

DE 102011054372 A1 4/2013
KR 20050100781 A 10/2005

*Primary Examiner* — Joseph C. Nicely
(74) *Attorney, Agent, or Firm* — Murphy, Bilak & Homiller, PLLC

(57) ABSTRACT

A transistor device includes a semiconductor substrate having a first major surface, a cell field and an edge termination region laterally surrounding the cell field. The cell field includes: elongate active trenches that extend from the first major surface into the semiconductor substrate, a field plate and a gate electrode being positioned in each elongate active trench, the gate electrode being arranged above and electrically insulated from the field plate; and elongate mesas, each elongate mesa being formed between neighbouring elongate active trenches, the elongate mesas comprising a drift region, a body region on the drift region and a source region on the body region.

16 Claims, 8 Drawing Sheets

Related U.S. Application Data division of application No. 17/156,720, filed on Jan. 25, 2021, now Pat. No. 11,545,568.

(51) Int. Cl.
  *H01L 29/423* (2006.01)
  *H01L 29/66* (2006.01)
  *H01L 29/739* (2006.01)

(52) U.S. Cl.
  CPC .. *H01L 29/66348* (2013.01); *H01L 29/66666* (2013.01); *H01L 29/66734* (2013.01); *H01L 29/7397* (2013.01); *H01L 29/7811* (2013.01); *H01L 29/7827* (2013.01)

(56) References Cited

U.S. PATENT DOCUMENTS

| | | |
|---|---|---|
| 10,529,845 B2 * | 1/2020 | Mirchandani ......... H01L 29/405 |
| 2005/0215010 A1 | 9/2005 | Henninger et al. |
| 2011/0076817 A1 | 3/2011 | Hiller et al. |
| 2013/0221431 A1 | 8/2013 | Musha et al. |
| 2015/0069610 A1 | 3/2015 | Grivna |
| 2017/0062574 A1 * | 3/2017 | Nagata ................. H01L 29/408 |
| 2018/0061644 A1 | 3/2018 | Laven et al. |
| 2018/0114857 A1 | 4/2018 | Okada et al. |
| 2019/0109216 A1 | 4/2019 | Cai et al. |
| 2020/0111896 A1 * | 4/2020 | Feil .................... H01L 29/7397 |
| 2020/0251565 A1 | 8/2020 | Su et al. |

* cited by examiner

TRANSISTOR DEVICE HAVING A FIELD PLATE

BACKGROUND

Transistors used in power electronic applications may be fabricated with silicon semiconductor materials. Common transistor devices for power applications include silicon CoolMOS®, silicon power MOSFETs and silicon insulated gate bipolar transistors (IGBTs). A transistor device for power applications may be based on the charge compensation principle and may include an active cell field including a plurality of elongate trenches, each including a field plate for charge compensation. The trenches and the mesas that are formed between adjacent trenches each have an elongate striped structure. DE 10 2011 054 372B4 discloses a method for fabricating a transistor structure including a plurality of trenches which include a field plate and a gate electrode positioned above the field plate in the trenches. However, further improvements would be desirable in order to further improve the reliability of these types of transistor devices.

SUMMARY

In an embodiment a transistor device comprises a semiconductor substrate having a first major surface, a cell field and an edge termination region laterally surrounding the cell field. The cell field comprises a plurality of elongate active trenches that extend from the first major surface into the semiconductor substrate, wherein a field plate and a gate electrode are positioned in each elongate active trench, the gate electrode being arranged above and electrically insulated from the field plate. The cell field also includes at least one elongate mesa, each mesa being formed between neighbouring elongate active trenches. The elongate mesas comprise a drift region, a body region on the drift region and a source region on the body region. A lower surface of the gate electrode is arranged at a depth $d_1$ from the first major surface at a position above the field plate and at a depth $d_2$ from the first major surface at a position laterally adjacent the field plate, wherein $d_2 > d_1$ and $d_2/d_1$ lies in the range of 1.005:1 to 2:1.

In some embodiments, the lower surface of the gate electrode comprises a profile comprising a ridge formed between two grooves.

In some embodiments, the gate electrode is electrically insulated from the field plate by an insulating layer that has a thickness $d_3$ above the field plate in a vertical direction and a thickness $d_4$ at an inclined angle to the vertical direction, wherein $d_3 > d_4$ and $d_3/d_4$ lies in the range of 1.01:1 to 3:1.

In some embodiments, the elongate active trench comprises a width $w_t$, wherein 1400 nm ≤ $w_t$ ≤ 1900 nm, and the field plate has a width $w_{fp}$, wherein 175 nm ≤ $w_{fp}$ ≤ 325 nm.

In some embodiments, the ratio between the depth $d_2$ of the gate electrode and the width $w_t$ of the active elongate active trench 15 may lie in the range of 1 to 2 to 2 to 1, i.e. 1:2 ≤ $d_2/w_t$ ≤ 2:1.

In some embodiments, the edge termination region comprises an edge termination structure comprising at least one elongate trench comprising an edge field plate. The edge field plate has a top surface positioned at a depth $d_{efp}$ from the first major surface and the field plates in the active trenches have a top surface positioned at a depth $d_{fp}$ from the first major surface and $d_{efp} < d_{fp}$, wherein 0 nm ≤ $d_{efp}$ ≤ 1500 nm and 800 nm ≤ $d_{fp}$ ≤ 1600 nm.

In some embodiments, the transistor device further comprises a gate contact extending from the first major surface into the gate electrode by a distance $d_c$ and $d_c - d_1$ is at least 50 nm.

In an embodiment, a method of forming a field plate in an elongate active trench of a transistor device is provided. The elongate active trench comprises a first insulating material lining the elongate active trench and surrounding a gap and first conductive material filling the gap. The method comprises selectively removing a first portion of the first insulating material using a first etch process, selectively removing a portion of the first conductive material using a second etch process and forming a field plate in a lower portion of the elongate active trench and selectively removing a second portion of the first insulating material using a third etch process. The first etch process, the second etch process and the third etch process are carried out in this order.

In some embodiments, after the first etch process side walls of an upper portion of the elongate active trench remain covered by the first insulating material and after the third etch process the side walls of the upper portion of the elongate active trench are exposed from the first insulating material.

In some embodiments, the selectively removing a first portion of the first insulating material using the first etch process comprises forming a first recess in the first insulating material and an exposed portion of the first conductive material. The exposed portion of the first conductive material protrudes above a base of the first recess and is spaced apart from side walls of the first recess. The exposed portion of the first conductive material is at least partially removed during the second etch process such that a position of the top surface of field plate with respect to the first major surface is set.

In some embodiments, the method further comprises, prior to the first etch process, removing a first portion of the first conductive material using an initial etch process. A position of a top surface of the field plate with respect to the first major surface is set using the initial etch process and the second etch process.

In some embodiments, the first insulating material is further positioned on the first major surface. After the first etch process, the first major surface of the semiconductor substrate remains covered by a remainder of the first insulating material and after the third etch process the first major surface of the semiconductor substrate is exposed from the first insulating material.

In some embodiments, the method further comprises, after the third etch process, insulating the field plate, forming a gate oxide on a side wall of the trench and forming a gate electrode above the insulated field plate in the elongate active trench.

In some embodiments, the insulating the field plate comprises forming a second insulating material on the side wall of the trench and on a top surface and side faces of an exposed portion of the field plate, removing the second insulating material from at least an upper portion of the side wall of the trench and exposing the upper portion of the side wall of the trench, and forming the gate oxide on the second insulating material and on the side wall of the trench.

In some embodiments, the second insulating material is non-conformally deposited on the top surface and the side faces of the exposed portion of the field plate, the second insulating material having a top surface having a profile including a ridge formed between two grooves. A base of the grooves may be positioned at a greater depth from the first major surface than the top surface of the field plate.

In some embodiments, the transistor device comprises a cell field comprising a plurality of elongate active trenches and an edge termination region laterally surrounding the cell field and comprising at least one edge termination trench. The method further comprises, in the edge termination region, setting a position of a top surface of an edge field plate in the edge termination trench with respect to the first major surface using a single etch process, the single etch process being the second etch process.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

FIG. 1b illustrates an enlarged view of a portion of a trench of the transistor device of FIG. 1a.

FIG. 1d illustrates a top view of the transistor device of FIG. 1a.

DETAILED DESCRIPTION

Figure 1A:
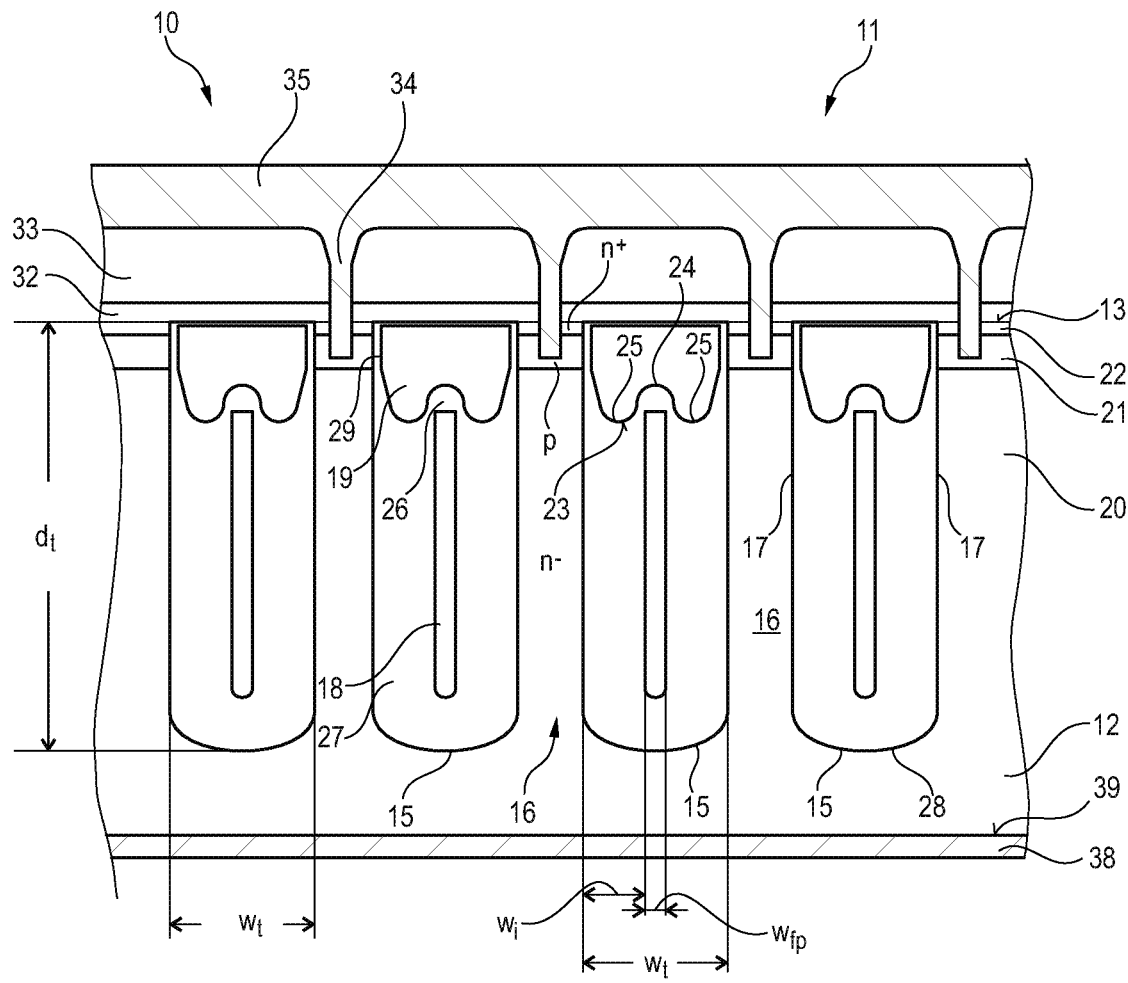
FIG. 1a illustrates a cross-sectional view of a portion of a cell field of a transistor device including elongate trenches.
Figure 1D:
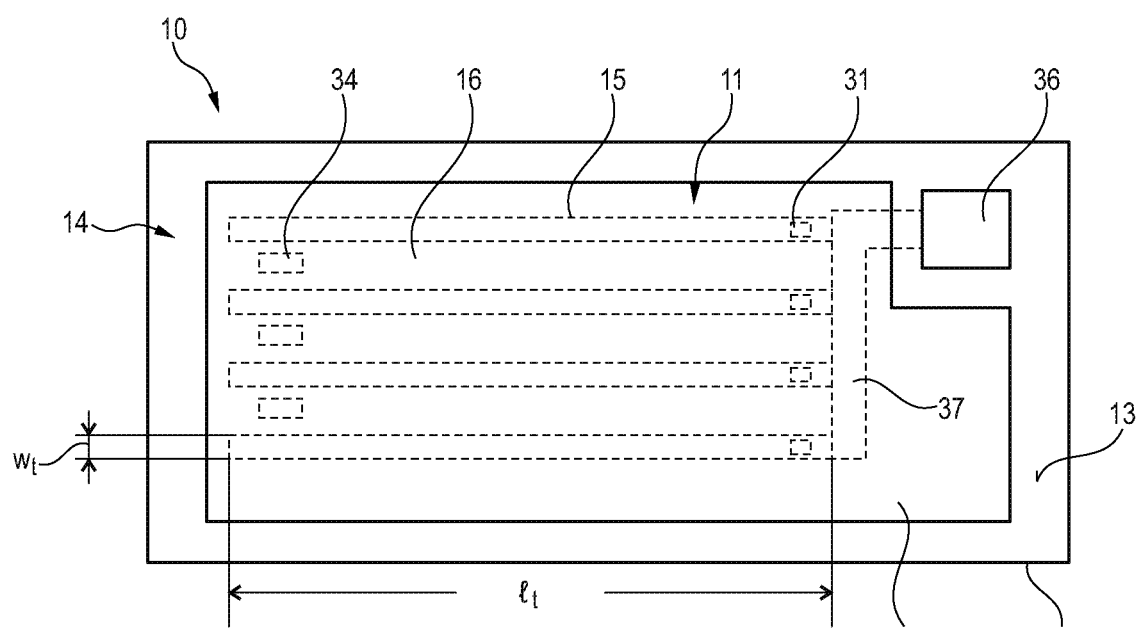

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of exemplary embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As used herein, various device types and/or doped semiconductor regions may be identified as being of n type or p type, but this is merely for convenience of description and not intended to be limiting, and such identification may be replaced by the more general description of being of a "first conductivity type" or a "second, opposite conductivity type" where the first type may be either n or p type and the second type then is either p or n type.

The Figures illustrate relative doping concentrations by indicating "−" or "+" next to the doping type "n" or "p". For example, "n$^-$" means a doping concentration which is lower than the doping concentration of an "n"-doping region while an "n$^+$"-doping region has a higher doping concentration than an "n"-doping region. Doping regions of the same relative doping concentration do not necessarily have the same absolute doping concentration. For example, two different "n"-doping regions may have the same or different absolute doping concentrations.

FIGS. 1a to 1d illustrate respective cross-sectional views and a top view of a transistor device 10 and, in particular, a portion of a cell field 11 of the transistor device 10.

The transistor device 10 comprises a semiconductor substrate 12 which has a first major surface 13. The semiconductor substrate 12 comprises silicon and may comprise an epitaxially deposited silicon layer, which may be formed on a further silicon substrate, or may be formed of monocrystalline silicon, for example a single crystal silicon wafer. The transistor device 10 includes the cell field 11 and an edge termination region 14 which laterally surrounds the cell field 11, as can be seen in the top view of FIG. 1d.

The cell field 11 provides the active region of the transistor device 10 and comprises a plurality of elongate active trenches 15 which extend from the first major surface 13 into the semiconductor substrate 12. Each trench 15 includes side walls 17 and a base 28. Typically, the elongate active trenches 15 extend substantially perpendicularly from the first major surface 13 into the semiconductor substrate 12 and each have the form of an elongate strip having a length $l_t$, a width $w_t$ and a depth $d_t$. The length of the elongate active trenches 15 extends into the plane of the drawing in the cross-sectional views illustrated in FIGS. 1a to 1c.

The cell field 11 also includes a plurality of elongate mesas 16 each being formed between neighbouring elongate active trenches 15. Each mesa 16 is, therefore, defined by two sidewalls 17 of two neighbouring elongate trenches 15 which face towards one another and has a top surface formed by first major surface 13. Each mesa 16 has an elongate strip type structure having a length extending into the plane of the drawing in the cross-sectional views of FIGS. 1a to 1c. The width of the mesa 16 is determine by the spacing between the two sidewalls 17 of two neighbouring elongate trenches 15 which face towards one another.

A field plate 18 and gate electrode 19 are positioned in each elongate active trench 15. The gate electrode 19 is arranged above, and is electrically insulated from, the field plate 18 within each trench 15. The field plate 18 and the gate electrode 19 are formed of electrically conductive material may each be formed of polysilicon, for example. The field plate 18 and the gate electrode 19 each have an elongate structure having a length which substantially corresponds to the length of the elongate active trench 15 and which extends into the plane of the drawing.

The elongate mesas 16 each comprise a drift region 20, a body region 21 on the drift region 20 and a source region 22 on the body region 21. The drift region 20 has a first conductivity type, the body region 21 has a second conductivity type which opposes the first conductivity type and the source region 22 has the first conductivity type. The first conductivity type may be n-type and second conductivity type may be p-type, for example.

The base 28 and sidewall 17 of each active trench 15 are lined with an insulating material 27 which has a thickness $w_i$. The gate electrode 19 is electrically insulated from the field plate 18 by an insulating layer 26 positioned between the lower surface 23 of the gate electrode 19 and the upper surface 30 of the field plate 18. A gate oxide 29 is positioned between the sidewalls 17 of the elongate active trench 15 and the side walls of the gate electrode 19, the gate oxide 29 having a thickness which is less than the thickness of the insulating material 28 positioned between the sidewalls of the field plate 18 and sidewall 17 of the elongate active trench 15.

The gate electrode 19 has a lower surface 23 that is not flat but has a profile including a ridge 24 formed between two elongate grooves 25. The gate electrode 19 has a lower surface 23 which is arranged at a depth $d_1$ from the first major surface 13 at a position above the field plate 18 and at a depth $d_2$ from the first major surface 13 at a position laterally adjacent the field plate 18. The lower surface 23 of the gate electrode may be arranged at a depth $d_2$ laterally adjacent two opposing sides of the field plate 18. The depth $d_2$ is greater than the depth $d_1$ such that a ratio of the depth $d_2$ to $d_1$ ($d_2/d_1$) lies in the range of 1.005 to 1 to 2 to 1, i.e. $1.005:1 \le d_2/d_1 \le 2:1$, or $1.25:1 \le d_2/d_1 \le 2:1$. $d_1$ is the distance between the first major surface 13 and the ridge 24 and $d_2$ is the distance between the first major surface 13 and the grooves 25.

The width $w_t$ of the elongate active trench 15 may depend on the voltage class of the transistor device. In some embodiments, the elongate active trench 15 has a width $w_t$ which lies between 1400 nm and 1900 nm. The field plate 18 may have a width $w_{fp}$ and $w_{fp}$ may lie within the range of 175 nm to 325 nm. This particular combination of the width $w_t$ of the elongate active trench 15 and the width $w_{fp}$ of the field plate 18 may be used for a transistor device having 120 V class.

The ratio between the depth $d_2$ of the position of the lowest surface 23 of the gate electrode 19 from the first major surface 13 and the width $w_t$ of the active elongate active trench 15 may lie in the range of 1 to 2 to 2 to 1, i.e. $1:2 \le d_2/w_t \le 2:1$.

The thickness of the insulating material 26 positioned between the lower surface 23 of the gate electrode 19 and the upper surface 30 of the field plate 18 varies at different positions across the width $w_t$ of the elongate active trench 15. The variations in the thickness of the insulating material 26 over the length $l_t$ of the trench 15 may be significantly less than the variations over the width $w_t$ of the elongate active trench 15. As can be seen more easily in the enlarged cross-sectional views of FIGS. 1b and 1c, the insulating layer 26 has a thickness $d_3$ at a position above the field plate 15 in a vertical direction, that is perpendicular to the first major surface 13 of the semiconductor substrate 12 and the base 28 of the elongate active trench 15. The insulating layer 26 has a thickness $d_4$ as an inclined angle to the vertical direction, as illustrated in the enlarged cross-sectional view of FIG. 1c, whereby $d_4$ is smaller than $d_3$, i.e. $d_4 < d_3$. In some embodiments, $d_3/d_4$ lies in the range of 1.9:1 to 3:1.

The first major surface 13 of the semiconductor substrate 12 and therefore the top surface of the mesas 16 may be covered by an insulating layer 32. One or more further insulating layers 33 may be arranged on top of the insulating layer 31. A metallisation structure is positioned on the first major surface 13 of the transistor device 10 which provides a source pad 35 and a gate pad 36, which can be seen in the top view of FIG. 1d.

Figure 1B:
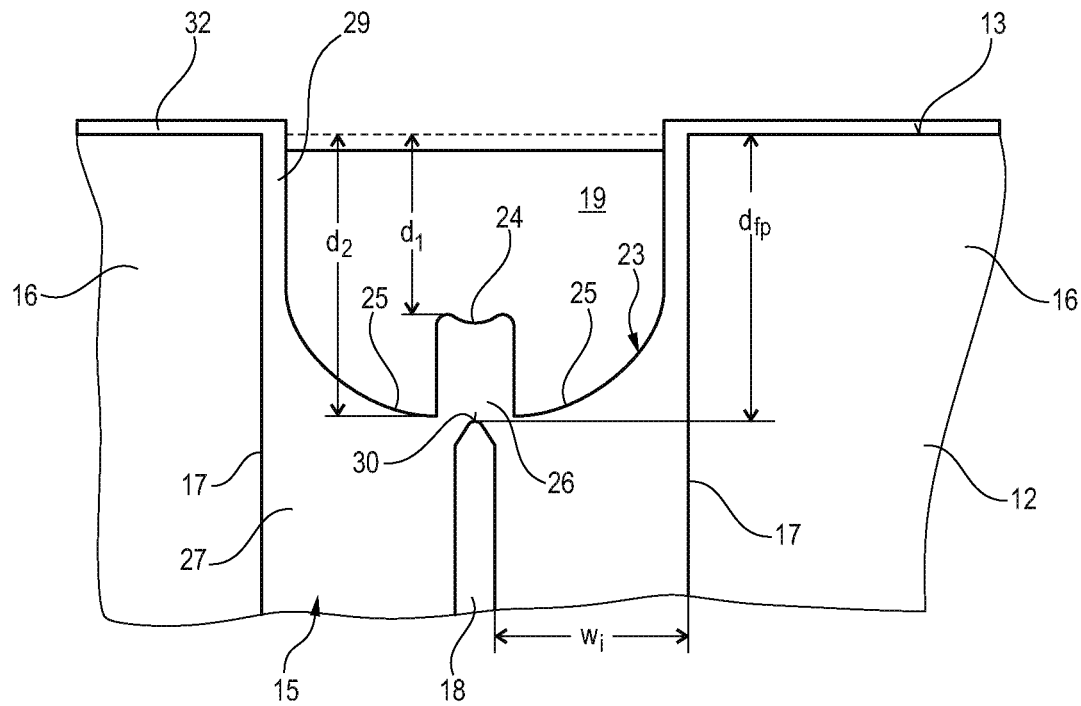
Figure 1C:
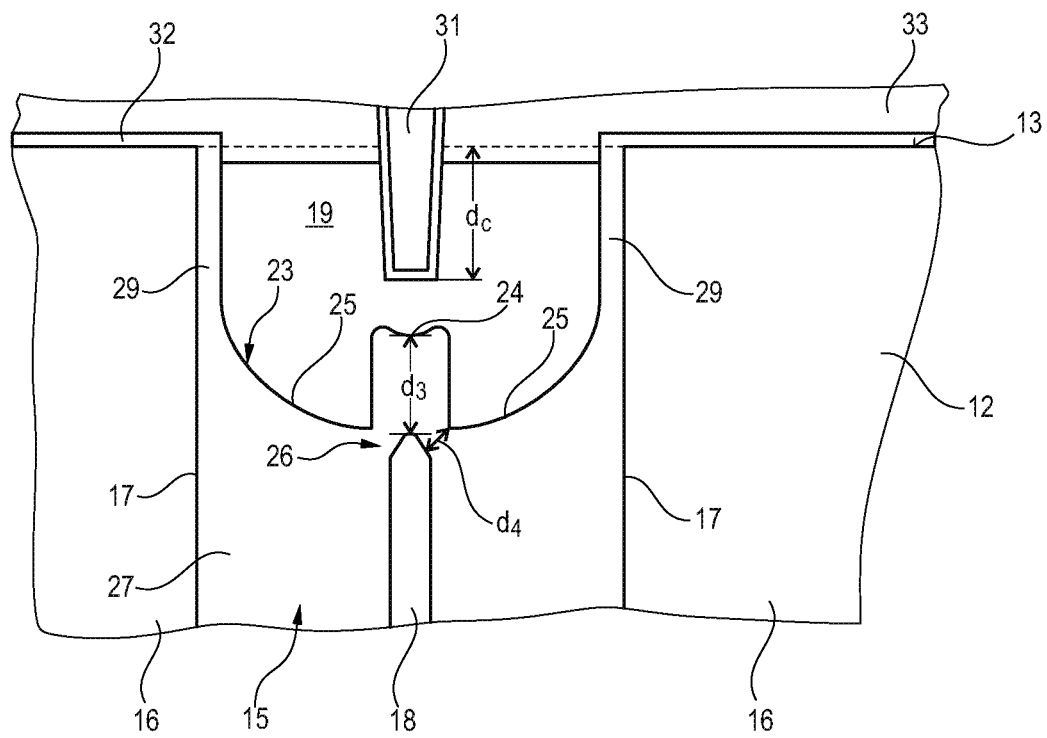
FIG. 1c illustrates an enlarged view of a cross-section of a different portion of the trench of FIG. 1b.

FIG. 1c illustrates a cross-sectional view of a position of the elongate active trench 15 in which the gate contact 31 to the gate electrode 19 positioned in the upper portion of the elongate active trench 15 can be seen. The gate contact 31 is typically positioned towards one end of the elongate gate electrode 19 and towards one end of the elongate active trench 15 such that a single vertical via structure provides an electrical connection for the elongate gate electrode 19.

The gate contact 31 may include one or more metals or alloys. The gate contact 31 may have a depth $d_c$ from the first major surface 13 into the gate electrode 19. The depth $d_c$ of gate contact 31 may depend on the voltage class of the transistor device 10 and also on the depth $d_1$ of the gate electrode 19. In some embodiments, dc may lie in the range of 400 nm to 700 nm, for example for a transistor device having a voltage class of 120V. For other types of voltage classes, for example transistor devices having a voltage class of 15 V or 20 V, dc may be smaller, for example 150 nm to 200 nm.

As is illustrated in FIG. 1a, a source contact 34 in the form of a conductive via is provided for each mesa 16. The source contact 34 extends through the insulating layers 32, 33 positioned on the first major surface 13 and has a base positioned in the body region 21 of each mesa 16. The source contacts 34 in each mesa 16 are electrically coupled to one another by a source metallisation to the source pad 35 on the first major surface 13, which can be seen in the top view of FIG. 1d. The transistor device 10 also includes a gate pad 36 on the first major surface 13 which is electrically coupled to the gate electrodes 19 positioned in the active trenches 15 by the gate contacts 31 and a gate runner 37 which extends between the gate contacts 31.

The transistor device 10 further includes a drain pad 38 which is positioned on second major surface 39 of the semiconductor substrate 12 which opposes the first major surface 13, as illustrated in FIG. 1a. The transistor device 10 is, therefore, vertical transistor device since it has a vertical drift path. The source pad 35, the gate pad 36 and the drain pad 38 may be formed from a metal or alloy and may include one layer or two or more sublayers.

A method of forming a field plate in an elongate active trench of a transistor device will now be described with reference to FIGS. 2a through 2i. The method may be used to fabricate the transistor device 10 illustrated in FIGS. 1a through 1d, for example, and is described with reference to this particular transistor device, but use of the method is not limited to fabricating this particular transistor structure.

FIGS. 2a through 2i illustrate respective cross-sectional views of a semiconductor substrate 12 including a first major surface 13. The semiconductor substrate 12 may include a Si epi layer or a monocrystalline silicon wafer. The semiconductor substrate 12 is processed to form a transistor device 10 having a cell field 11 that is laterally surrounded by an edge termination region 14. The cell field 11 includes a plurality of elongate active trenches 15 and the edge termination region 14 includes one or more edge termination trenches 40. In FIGS. 2a through 2i, two elongate active trenches 15 and one edge termination trench 40 are illustrated. The elongate active trenches 15 and the edge termination trench 40 extend from the first major surface 13 into the semiconductor substrate 12 and are defined by side walls 17 that extend substantially perpendicularly to the first major surface 13 and a base 28 that extends between the side walls 17. The length of the trenches 15, 40 extends into the plane of the drawing in FIGS. 2a through 2i.

Typically, the semiconductor substrate 12 has the form of a semiconductor wafer including large number of device positions each forming one transistor device 10. After fabrication of the transistor devices 10 at the wafer level is complete, the individual transistor devices 10 are singulated from the wafer.

A mesa 16 is formed between two neighbouring elongate active trenches 15 and has an elongate strip like form with a height corresponding to the depth $d_t$ of the elongate active trenches 15, and a length corresponding to the length $l_t$ of the elongate active trenches 15. The width of the mesa 16 corresponds to the spacing between side walls 17 of the two neighbouring elongate active trenches 15 that face towards one another.

In some embodiments, the edge termination trenches 40 have a greater depth $d_{edge}$ than the depth $d_t$ of the elongate active trenches 15 in the cell field 11. The width $w_{edge}$ of the edge termination trench 40 may also differ from the width $w_t$ of the elongate active trenches 15 and may be wider.

Figure 2A:
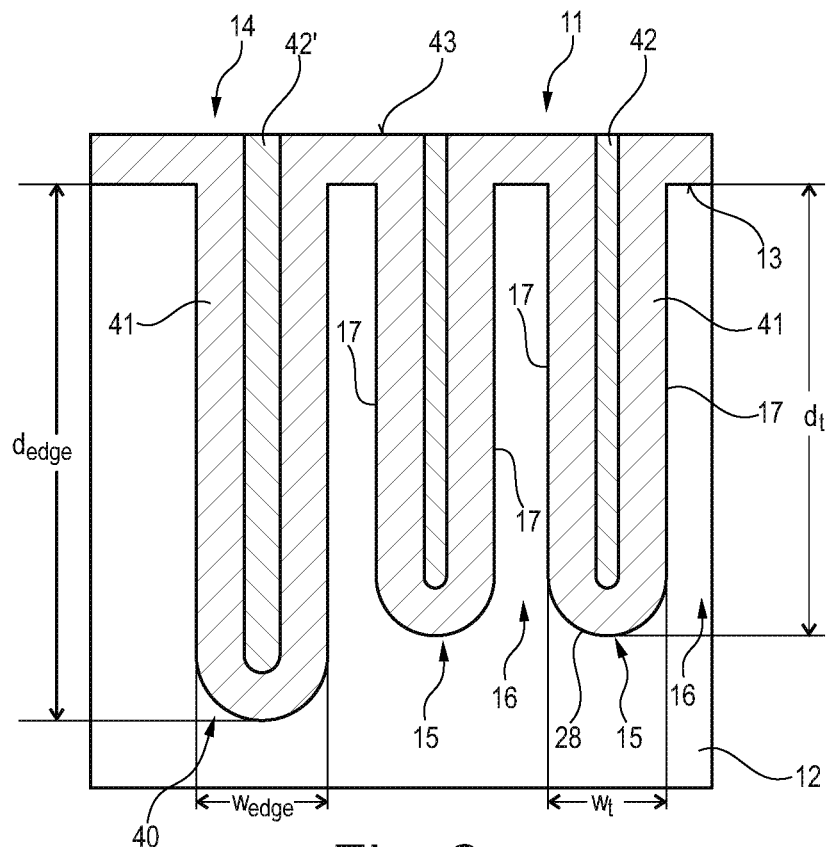
FIGS. 2a to 2i illustrate a method of forming a field plate in an elongate active trench of a transistor device.

Referring to FIG. 2a, each of the elongate active trenches 15 and the edge termination trench 40 are lined with a first insulating material 41. The first insulating material 41 also extends over the first major surface 13 and, therefore, over the top surface of the mesas 16 that are formed between the elongate active trenches 15 and forms a continuous layer. The first insulating material 41 surrounds a gap which is formed towards the centre of each of the elongate active trenches 15 and the edge termination trench 40. This gap has been filled by conductive material 42 which extends to the uppermost surface 43 of the first insulating material 41 positioned on the first major surface 13. The first insulating material 41 may be silicon oxide and the conductive material 42 may be polysilicon.

In some embodiments, the first insulating material 41 includes two sublayers of silicon oxide that are fabricated using different methods. For example, the first insulating material 41 may include a first sublayer formed by thermal oxidation of the semiconductor substrate 12 and a second sublayer that is formed by a TEOS (Tetraethyl orthosilicate) deposition process that is positioned on the first sublayer. After deposition of the first insulating material 41 and the conductive material 42, a planarization process may be carried out to form a planarized upper surface 43 in which the conductive material 42 is coplanar with the first insulating material 41.

Figure 2B:
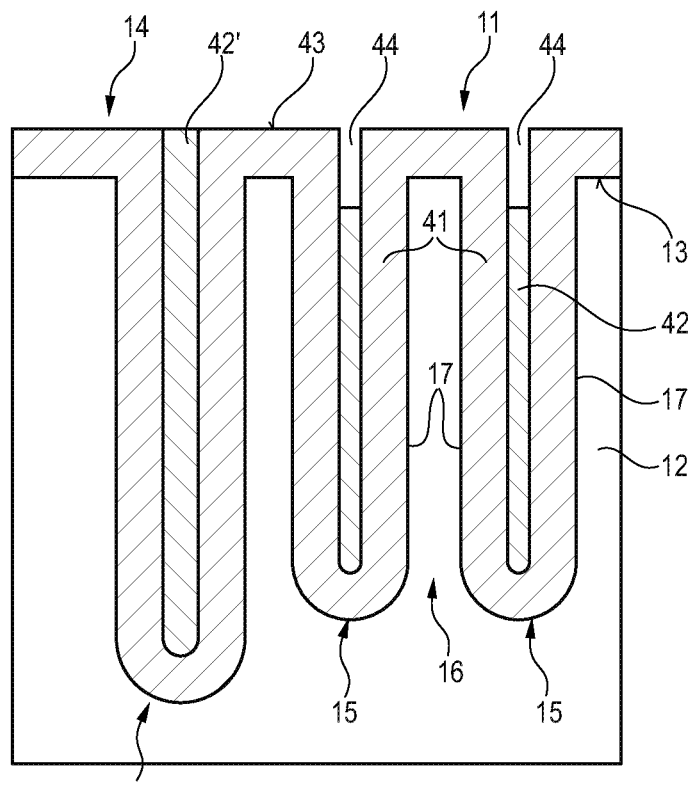

FIG. 2b illustrates the semiconductor substrate 12 after an initial etch process has been carried out to selectively remove some of the conductive material 42 from an upper region of the elongate active trenches 15 such that an indentation 44 is formed in the first insulating material 41 in the upper portion of the active elongate trenches 15. The indentation 44 has side walls formed by the first insulating material 41 positioned on the side walls 17 of the elongate active trenches 15 and a base formed by the remainder of the conductive material 42. The base of the indentation 44 is positioned at a depth from the first major surface 13 within the semiconductor substrate 12. The first insulating material 41 remains on the first major surface 13 and forms a continuous layer.

The conductive material 42 may be selectively removed compared to the first insulating material 41 from the elongate active trenches 15 by an etch process, such as a wet etch process for example. The conductive material 42' positioned in the edge termination trench 40 has, however, not been removed such that the conductive material 42' in the edge termination trench 40 is coplanar with the upper surface 43 of the first insulating layer 41. The edge termination trench 40 may be covered by mask to prevent removal of the conductive material 42' in the edge termination trench 40 during the initial etching process to remove the conductive material 42 from the elongate active trenches 15.

The selectivity of the material of the conductive material 42 over the material of the first insulating material 41 may be at least around 100 to 1, for example, or for a dry etch around 10:1.

Figure 2C:
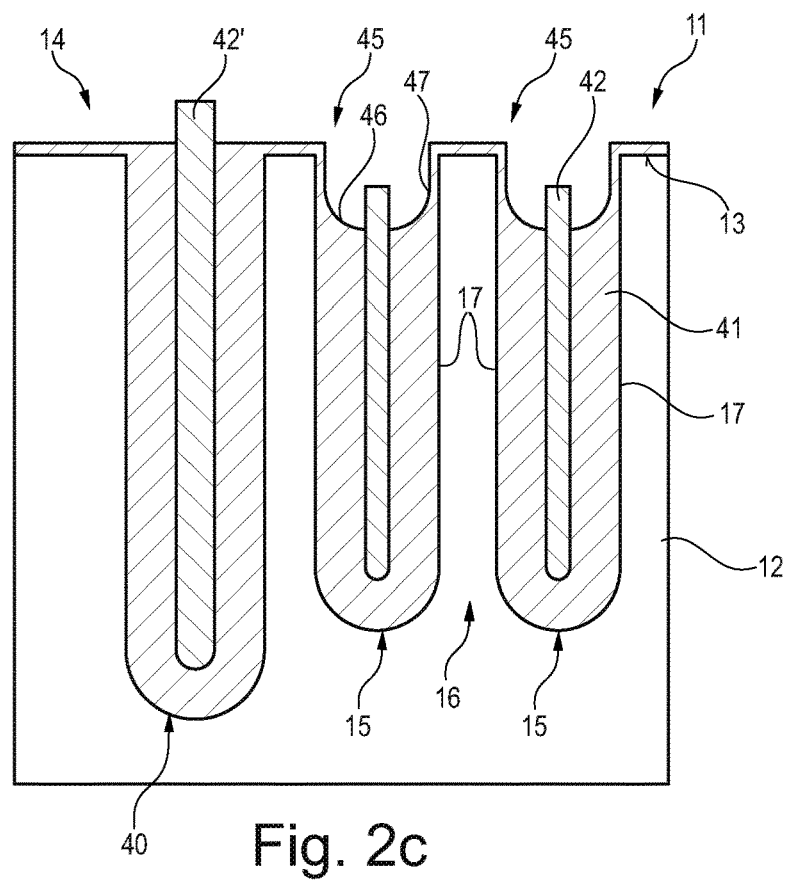

As illustrated in FIG. 2c, a first etch process is then carried out to remove a portion of the first insulating material 41 from an upper portion of the elongate active trenches 15 and from the first major surface 13 of the semiconductor substrate 12. The first insulating material 41 may be selectively removed with respect to the conductive material 42. A first recess 45 is formed in the insulating material 41 in the elongate active trenches 15 that has a sidewall 47 and a base 46.

The first etch process exposes a portion of the conductive material 42 from the first insulating material that protrudes above the base 46 of the first recess 45 and is spaced apart from the sidewalls 47 of the first recess 45. The sidewalls 17 of the active trenches 15 and the first major surface 13 of the semiconductor substrate 12 remain covered by a portion of the first insulating layer 41 after the first etch process. The first insulating material 41 remaining on the side walls 17 and base 28 of the elongate active trenches 15 provides the field oxide 27 of the transistor device 10.

The first insulating material 41 is also selectively removed from a region above the edge termination trench 40 such that a portion of the conductive material 42' is exposed from the first insulating material 41 and protrudes above the remainder of the first insulating layer 41 in the edge termination trench 40.

The first insulating layer 41 is selectively removed over the conductive material 42, 42', for example by wet etching. The selectivity of the material of the first insulating material 41 over the material of the conductive material 42 may be at least around 100 to 1. The first insulating layer 41 may include silicon oxide and may be removed by wet etching. For example, a thickness of around 100 nm of the silicon oxide can remain on the first major surface 13 and side walls 17 in the upper portion of the elongate active trenches 15 after the first etching process and form a continuous layer.

Figure 2D:
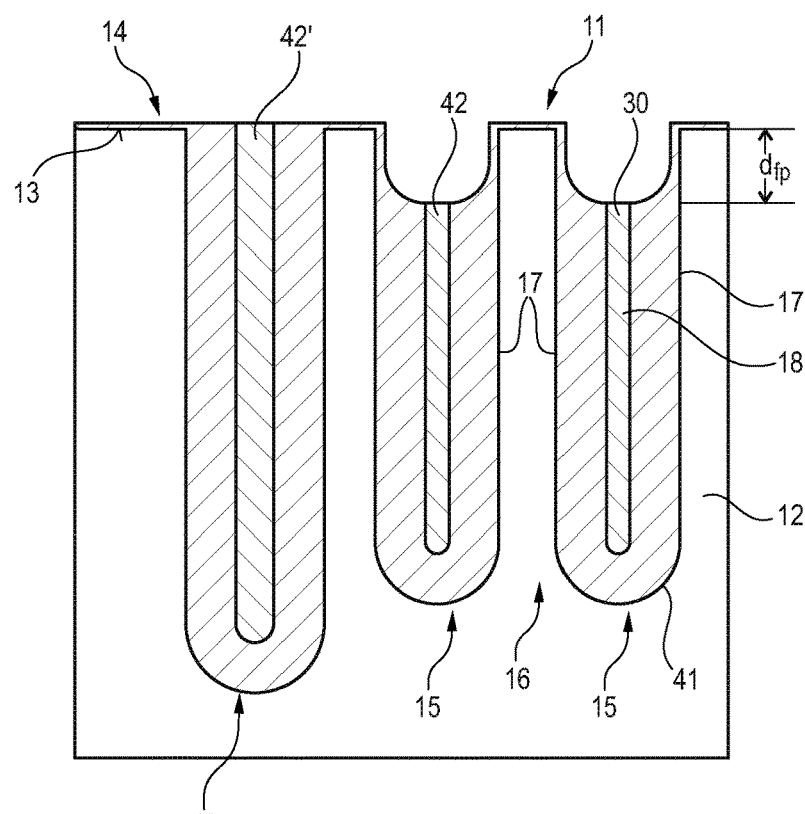

Referring to FIG. 2d, a second etch process is carried out to selectively remove a portion of the first conductive material 42 so as to form a field plate 18 in lower portion of the elongate active trench 15. After the first etching process, in which a first portion of the first insulating layer 41 is removed, the remaining portion of the first insulating layer 41 can be used as a mask when removing the conductive material 42, 42' from not only the elongate active trenches 15 but also the edge termination trenches 40. The conductive material 42 is selectively removed over the first insulating layer 41, for example by wet etching. The selectivity of the material of the conductive material 42 over the material of the first insulating layer 27 may be around 100 to 1, or for a dry etch around 5:1.

After the second etch process, the upper surface 30 of the field plate 18 is, therefore, positioned at a depth $d_{fp}$ from the first major surface 13 and this depth is set using a combination of the initial etching process which removes the first portion of the conductive material 42, as illustrated with reference to FIG. 2b, and the second etching process, as illustrated with reference to FIG. 2d, to remove the exposed portion of the conductive material 42.

The first etch process to remove the first insulating material 41 and form the first recess 45 exposes a portion of the conductive material 42 which protrudes from a base 46 of the recess 45, as illustrated in FIG. 2c. The first etch process is carried out between the initial etch process and the second etch process. Consequently, in the initial etch process, the etch solution comes into contact with only the upper surface of the conductive material 42, since the side faces of the conductive material 42 are in contact with the first insulating layer 41, as illustrated in FIG. 2b. In contrast, in the second etch process as illustrated in FIG. 2d, the etch solution can come into contact with side faces and the top face of the exposed portion of the conductive material 42.

Figure 2E:
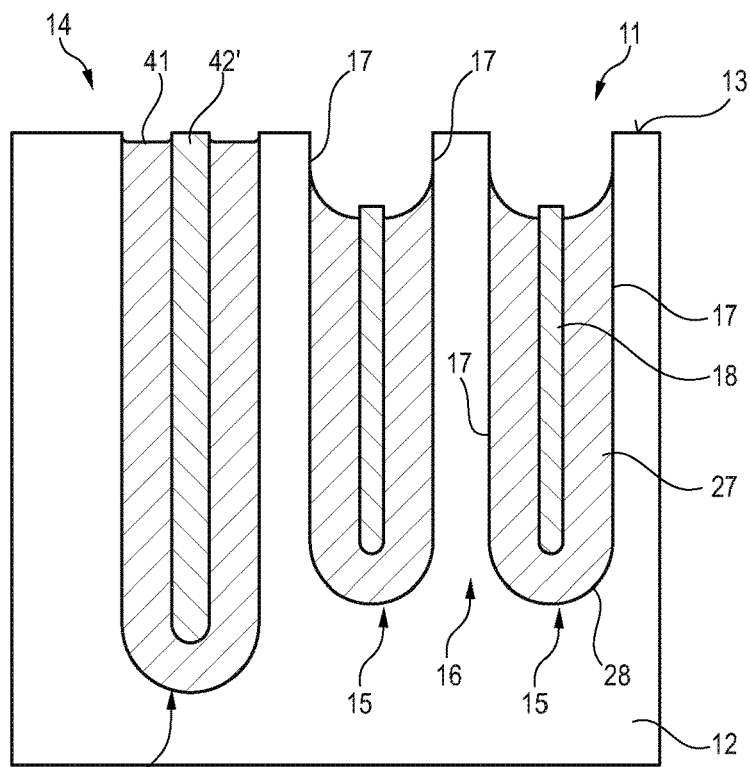

Referring to FIG. 2e, a third etch process may be used to selectively remove a second portion of the first insulating layer 41 such that an upper portion of the sidewalls 17 of the elongate active trenches 15 is exposed from the first insulating material 41. The conductive material 42 forming the field plate 18 protrudes from the remainder of the first insulating material 41 in the elongate active trenches 15, since the first insulating material 41 is removed from the base 46 of the first recess 45 in addition to the side walls 47.

In some embodiments, the first major surface 13 may also be exposed from the first insulating material 41 so that the first insulating material 41 no longer forms a continuous layer. In some embodiments, the uppermost portion of the first insulating layer 41 positioned in the edge termination trench may also be removed such that the conductive material 42' in the edge termination trench 40 protrudes above the top surface of the insulating material 41 remaining in the edge termination trench 40.

The first insulating material 41 is, therefore, removed from the upper portion of the sidewalls 17 of the elongate active trenches 15 using the first etch process and the third etch process, whereby the second etch process in which the conductive material 42 is selectively removed, is performed after the first etch process and before the third etch process.

The first insulating material 41 is selectively removed over the conductive material 42, for example by wet etching. The selectivity of the material of the first insulating material 41 over the material of the conductive material 42 in the third etch process may be around at least 100 to 1.

The depth $d_{fp}$ of the upper surface 30 of the field plate 18 is, therefore, set with respect to the first major surface 13 by the initial selective removal process in which the conductive material 42 is removed selectively over the first insulating layer 41 providing field oxide and by the second etching process in which the conductive material 42 is selectively removed over the remainder of the first insulating layer 41. The first insulating material 41 is also removed in two stages by the first and third etch processes such that at least at the uppermost portion of the trench 15, the sidewalls 17 of the trench 15 and crystalline material of the semiconductor substrate 12 are exposed after the third etch process.

Figure 2F:
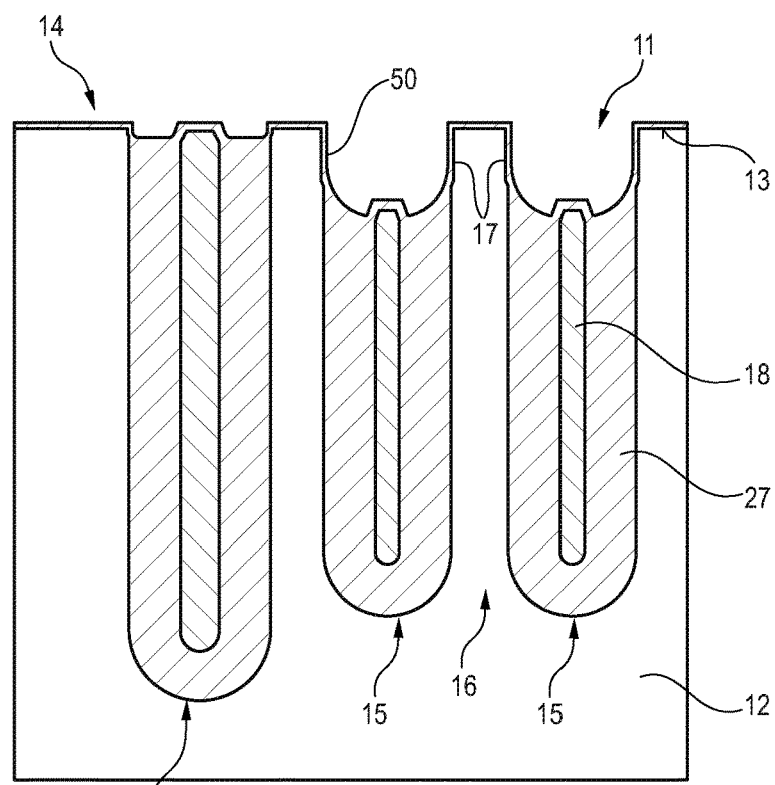

Referring to FIG. 2f, a second insulating layer 50 is formed which covers the exposed portions of the sidewalls 17, the first major surface 13 and exposed portions of the field plate 18 in the elongate active trench 15 and the conductive material 42' forming an edge termination field plate 51 in the edge termination trench 40. The second insulating layer 50 may form a continuous layer such that it also extends over the first insulating material 41 positioned in the trenches 15, 40 and may be used as is part of the electrical insulation 26 between the field plate 18 and the gate electrode 19 which is to be formed in each of the elongate active trenches 15.

After the second removal process of the first insulating layer 41 in the third etch process, the freestanding conductive material forming an upper portion of the field plate 18 may have an aspect ratio which may be a maximum of one.

Since the wet etching material comes into contact with both the top surface and side faces of the exposed portion of the conductive material 42 in the third etch process, this conductive material 42 can be removed more isotropically, i.e. from both the top and side faces, so that the remaining structure has a lower aspect ratio and is more stable. This also allows the free standing exposed portion to be more easily oxidised to form the second insulating layer 50 and the electrical insulation 26 between the field plate 18 and the subsequently formed gate electrode 19 and also results in the free lying structure being mechanically more stable than structure including a larger aspect ratio.

In some embodiments, the second insulating layer 50 has a greater thickness on the polysilicon material of the field plate 18 than on the silicon of the semiconductor substrate 12. In some embodiments, the second insulating layer 50 may be formed non-conformally onto the top surface and side faces of the exposed portion of the field plate 18 such that the thickness of the second insulating layer 50 in the vertical direction, that is a direction which is substantially perpendicular to the first major surface 13 and to the length of the field plate 18, is greater than the thickness of the second insulating layer 50 deposited on the side faces of the exposed portion of the field plate 18. In some embodiments, the second insulating layer 50 may be conformally deposited on the top surface and side faces of the exposed portion of the field plate 18 so that the thickness of the second insulating layer 50 is substantially uniform.

After formation of the second insulating layer 50, the second insulating layer 50 has a top surface having a profile 52 including a ridge 53 or raised region formed between two grooves 54. The ridge 53 is formed vertically above the field plate 18 and the grooves 54 are formed laterally adjacent to opposing side faces of the field plate 18 within the elongate active trench 15. The base of the grooves 54 is positioned at a greater depth from the first major surface 13 than the top surface 30 of the field plate 18, in some embodiments.

Figure 2G:
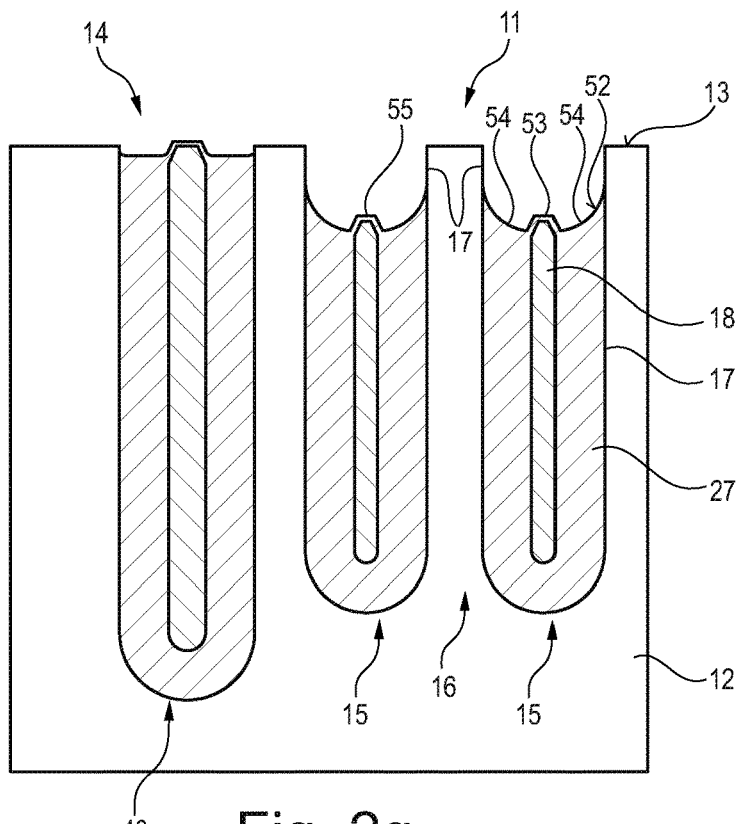

Referring to FIG. 2g, the second insulating layer 50 may then be removed so as to expose a side face 17 of the elongate active trenches 15 in the upper portion. The second insulating material 50 may also be completely removed from the side walls in the upper portion of the edge termination trench 40. The second insulating layer 50 may be referred to as a sacrificial oxide.

In some embodiments, the second insulating layer 50 is formed on the sidewalls 17 of the trench 15 and on the top surface of the mesas 16 in addition to the top surface and side faces of an exposed portion of the field plate 18. The second insulating layer 50 may be formed by a silicon oxide which is produced by thermal oxidation and may be known as POLOX. This material grows to greater thickness on the top and side faces of the field plate 18 compared to the side walls 17 of the elongate active trench 15 and the first major surface 13, since the silicon material of the field plate 18 is more highly doped with the first conductivity type than the silicon material of the semiconductor substrate 12 which forms the side faces 17 of the elongate active trenches 15 and also the top surface of the mesas 16. Consequently, after removing the second insulating layer 50 from at least an upper portion of the sidewall 17 of the trench 15 in the third etching process, illustrated with reference to FIG. 2g, a portion of the second insulating layer 50 positioned on the top and side faces of the field plate 18 may remain due to the greater initial thickness.

In some embodiments, the field plate 18 remains covered by the remaining portion of the second insulating 50 layer such that the top surface 52 of the second insulating layer 50 has a profile including a ridge 53 formed above the field plate 18 defined by two grooves 54 which are positioned on either sides of the field plate 18. This arrangement may result from the different thicknesses of the second insulating layer 50 on the polysilicon material of the field plate 18 compared to the first insulating material 41.

Figure 2H:
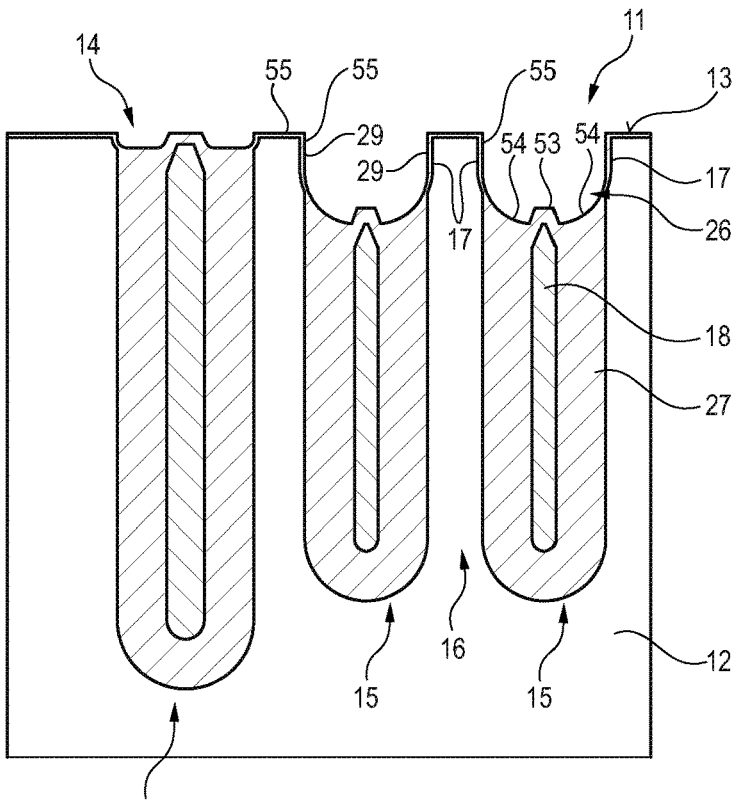

Referring to FIG. 2h, a third insulating layer 55 is then formed on at least the exposed portions of the sidewall 17 of the elongate active trenches 15 to form the gate oxide 29. In some embodiments, the third insulating layer 55 is formed as a continuous layer over the first major surface 13, the sidewalls 17 of the elongate active trenches 15, the second insulating layer 50 remaining in the elongate active trenches and in the edge termination trench 40. The total thickness of the insulating material 26 positioned on the field plate 18 and insulating the field plate 18 from the gate electrode 19 may be formed of the remainder of the second and third insulating layers 50, 55.

Figure 2I:
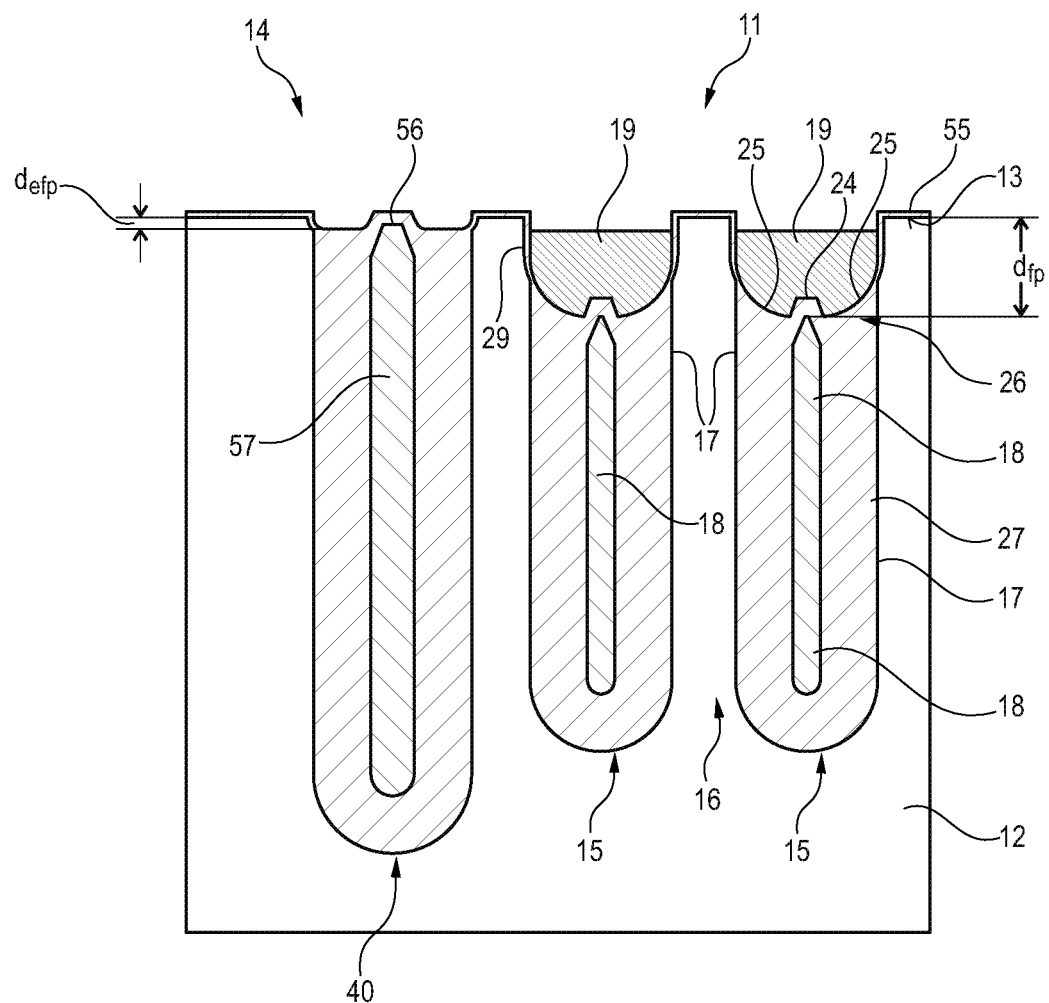

Referring to FIG. 2i, the conductive material for forming the gate electrode 19 is then deposited into the active elongate active trenches 15. The conductive material may be polysilicon or may be a metal or alloy. The lower surface 23 of the gate electrode 19 has a profile including a ridge 24 positioned between two grooves 25. The profile of the lower surface 23 of the gate electrode 19 is conformal to the underlying profile of the third insulating layer 55 which in turn is conformal to the underlying profile of the second insulating layer 50 which covers the field plate 18. The upper surface of the ridge 24 is positioned at a distance $d_1$ from the first major surface 13 and the deepest most point of the grooves 25 is positioned at a distance $d_2$ from the first major surface 13, $d_2$ being greater than $d_1$.

In the edge termination region 14, the position of a top surface 56 of an edge field plate 57 in the edge termination trench 40, $d_{efp}$, is set with respect to the first major surface 13 using a single etch process, the single etch process being the second etch process, whereas in the cell field 11, the position of the top surface 30 of the field plate 18, $d_{fp}$, is set with respect to the first major surface 13 using both the initial etch process and the second etch process. Therefore, the top surface 30 of the field plates 18 in the active trench 15 is positioned at a greater depth from the first major surface 13 than the top surface 56 of the conductive material 42' providing the edge field plate 57 in the edge termination trench 40 so that $d_{fp} > d_{efp}$.

In some embodiments, the upper surface of the gate electrode 19 may be positioned below the level of the first major surface 13 so that the minimum height of the gate electrode 19 is slightly less than $d_1$. After deposition of the conductive material of the gate electrode 19, a planarization process may be carried out, for example chemical mechanical polishing, followed by a dry etch.

The method may continue by forming a body region 21 in the mesas 16 by implanting dopants of the second conductivity type, forming a source region 22 on the body region 21 by implanting dopants of the first conductivity type, by applying one or more insulating layers 32, 33 onto the first major surface 13, by forming conductive vias forming the source contact 34 and gate contacts 31 and by forming a subsequent metallisation structure to electrically couple the source contacts 34 to the source pad 35 and the gate contacts 31 to the gate pad 36. The drain pad 38 may be formed on the second major surface 31 of the semiconductor substrate 12.

In FIG. 1a, the insulating layer 32 may be a thermally grown oxide that may have a thickness of around 15 nm. In FIG. 1b, the insulating layer 32 is a deposited oxides layer, for example a TEOS layer, that may have a thickness of around 250 nm.

In some embodiments, the thickness of the substrate 12 is reduced by removing portions of the rear surface of the semiconductor substrate 12, for example by grinding and/or chemical mechanical polishing, before applying the conductive layer to the rear surface 39 to form the drain pad 38. In some embodiments, a drain region is formed in the semiconductor substrate 12 at or near the second major surface 39. The drain region is highly doped with the first conductivity type and electrically connected to the drain pad 38.

Figure 3:
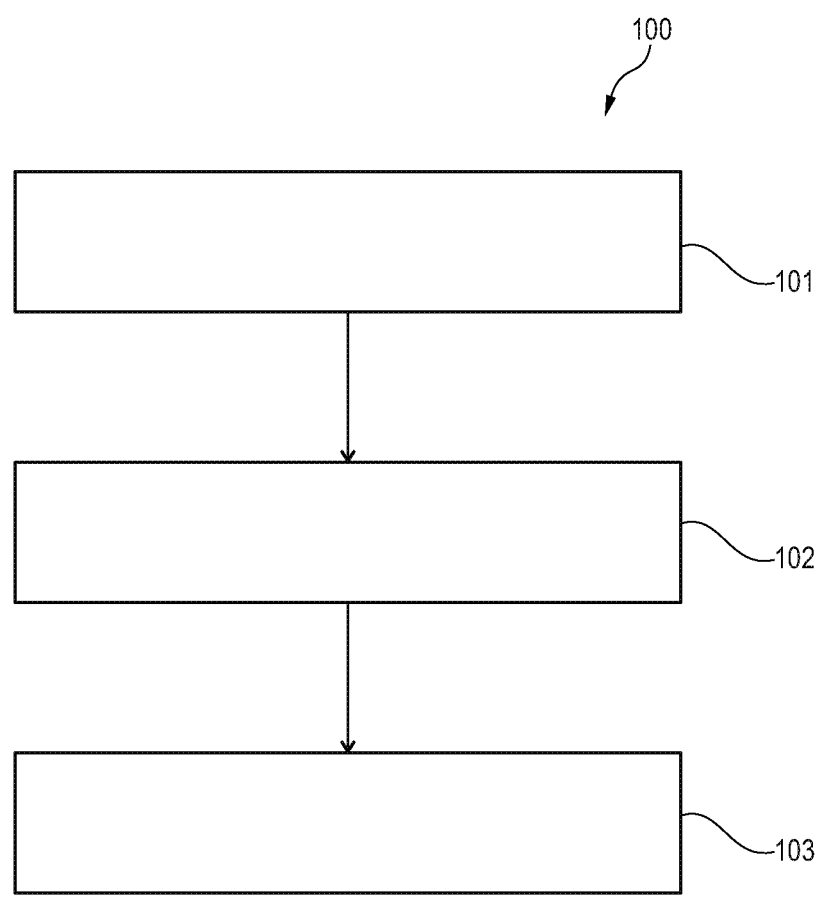
FIG. 3 illustrates a flow chart of a method of forming a field plate in an elongate active trench of a transistor device

FIG. 3 illustrates a flowchart 100 of a method for of forming a field plate in an elongate active trench of a transistor device. The elongate active trench comprises a first insulating material lining the elongate active trench and surrounding a gap and first conductive material filling the gap.

In block 101, a first portion of the first insulating material is selectively removed, for example using a first etch process. In block 102, a portion of the first conductive material is selectively removed, for example using a second etch process and a field plate is formed in a lower portion of the elongate active trench. In block 103, a second portion of the first insulating material selectively removed, for example using a third etch process. As the flow chart 100 shows, the first etch process, the second etch process and the third etch process are carried out in this order.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A transistor device, comprising:
a semiconductor substrate comprising a first major surface, a cell field, and an edge termination region,
wherein the cell field comprises at least two trenches that extend from the first major surface into the semiconductor substrate,
wherein a field plate and a gate electrode are positioned in each of the at least two trenches, the gate electrode being arranged above and electrically insulated from the field plate,
wherein for the at least two trenches, a lower surface of the gate electrode is arranged at a depth di from the first major surface at a position above the field plate and at a depth d2 from the first major surface at a position laterally adjacent the field plate,
wherein $d_2 > d_1$ and $d_2/d_1$ lies in a range of 1.005:1 to 2:1,
wherein the edge termination region comprises at least one edge trench that extends from the first major surface into the semiconductor substrate,
wherein an edge field plate is positioned in the at least one edge trench,
wherein the at least one edge trench extends deeper into the semiconductor surface than the at least two trenches.

2. The transistor device of claim 1, wherein a width of the edge field plate in the at least one edge trench is greater than a width of each of the field plates in the at least two trenches.

3. The transistor device of claim 2, wherein a height of the edge field plate in the at least one edge trench is greater than a height of each of the field plates in the at least two trenches.

4. The transistor device of claim 3, wherein the edge field plate has a top surface positioned at a depth $d_{efp}$ from the first major surface, wherein the field plates in the at least two trenches have a top surface positioned at a depth $d_{fp}$ from the first major surface, and wherein $d_{efp} < d_{fp}$.

5. The transistor device of claim 4, wherein 0 nm$\leq d_{efp} \leq$1500 nm and 800 nm$\leq d_{fp} \leq$1600 nm.

6. The transistor device of claim 4, wherein a width of the at least one edge trench is greater than a width of each of the at least two trenches.

7. The transistor device of claim 6, wherein at least one of the at least two trenches comprises a width wt, and wherein 600 nm$\leq w_t \leq$3500 nm.

8. The transistor device of claim 7, wherein 1400 nm$\leq w_t \leq$1900 nm.

9. The transistor device of claim 7, further comprising:
an insulating layer covering the at least two trenches;
one or more further insulating layers arranged on top of the insulating layer; and
a metallisation structure positioned over the first major surface of the transistor device,
wherein the metallisation structure at least provides a source pad,
wherein the cell field further comprises at least one mesa formed between the at least two trenches, the at least one mesa comprising a drift region, a body region on the drift region, and a source region on the body region,
wherein a source contact extends from the metallisation structure through the insulating layer and the one or more further insulating layers,
wherein the source contact has a base positioned in the body region formed between the at least two trenches.

10. The transistor device of claim 3, further comprising an insulating layer covering at least the at least two trenches.

11. The transistor device of claim 10, further comprising one or more further insulating layers arranged on top of the insulating layer.

12. The transistor device of claim 11, further comprising a metallisation structure positioned over the first major surface of the transistor device.

13. The transistor device of claim 12, wherein the metallisation structure provides at least a source pad.

14. The transistor device of claim 13, wherein a source contact extends from the metallisation structure through the insulating layer and the one or more further insulating layers, and wherein the source contact has a base positioned in a body region positioned between the at least two trenches.

15. The transistor device of claim 1, wherein for at least one of the at least two trenches, the gate electrode is electrically insulated from the field plate by an insulating layer that has a thickness $d_3$ above the field plate in a vertical direction and a thickness $d_4$ at an inclined angle to the vertical direction, and wherein $d_3 > d_4$ and $d_3/d_4$ lies in the range of 1.01:1 to 3:1.

16. The transistor device of claim 1, wherein the cell field further comprises at least one mesa formed between the at least two trenches, the at least one mesa comprising a drift region, a body region on the drift region, and a source region on the body region.

* * * * *

UNITED STATES PATENT AND TRADEMARK OFFICE
CERTIFICATE OF CORRECTION

PATENT NO. : 12,094,969 B2
APPLICATION NO. : 18/487505
DATED : September 17, 2024
INVENTOR(S) : S. Tegen et al.

It is certified that error appears in the above-identified patent and that said Letters Patent is hereby corrected as shown below:

In the Claims

Column 13, Line 19 (Claim 1) please change "depth di" to -- depth $d_1$ --

Column 13, Line 49 (Claim 7) please change "width wt" to -- width $w_t$ --

Signed and Sealed this
Twelfth Day of November, 2024

Katherine Kelly Vidal
*Director of the United States Patent and Trademark Office*